US009013949B2

(12) United States Patent
Schreiber et al.

(10) Patent No.: US 9,013,949 B2
(45) Date of Patent: Apr. 21, 2015

(54) MEMORY ACCESS CONTROL SYSTEM AND METHOD

(75) Inventors: Russell Schreiber, Austin, TX (US); Vikram Suresh, Amherst, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 491 days.

(21) Appl. No.: 13/330,172

(22) Filed: Dec. 19, 2011

(65) Prior Publication Data

US 2013/0155793 A1 Jun. 20, 2013

(51) Int. Cl.
*G11C 8/08* (2006.01)
*G11C 11/418* (2006.01)

(52) U.S. Cl.
CPC ................ *G11C 11/418* (2013.01); *G11C 8/08* (2013.01)

(58) Field of Classification Search
USPC ........................ 365/154, 189.16, 230.06, 194
See application file for complete search history.

(56) References Cited

U.S. PATENT DOCUMENTS

| | | | | |
|---|---|---|---|---|
| 2004/0076892 | A1* | 4/2004 | Pierrat | 430/5 |
| 2006/0050572 | A1* | 3/2006 | Gouin et al. | 365/194 |
| 2007/0109878 | A1* | 5/2007 | Gouin et al. | 365/189.11 |
| 2009/0224396 | A1* | 9/2009 | Becker | 257/691 |
| 2011/0115524 | A1* | 5/2011 | Rowhani | 326/93 |
| 2011/0158029 | A1* | 6/2011 | Sasaki | 365/230.06 |
| 2012/0170390 | A1* | 7/2012 | Idgunji et al. | 365/194 |

OTHER PUBLICATIONS

Vikas Chandra et al., "On the Efficacy of Write-Assist Techniques in Low Voltage Nanoscale SRAMs", Design, Automation & Test in Europe Conference procedings, Mar. 2010, pp. 345-350.*

* cited by examiner

*Primary Examiner* — Hoai V Ho
*Assistant Examiner* — Jay Radke
(74) *Attorney, Agent, or Firm* — Faegre Baker Daniels LLP

(57) ABSTRACT

The present disclosure relates to a method and system for controlling memory access. In particular, a method for controlling memory access includes, in response to receiving a write request operative to write data to at least one memory cell of a plurality of memory cells, increasing a word line voltage above a nominal level after a predetermined delay following the receipt of the write request. A disclosed system includes a word line driver operative to increase a word line voltage above a nominal level during a write access after a predetermined delay in response to a write request.

26 Claims, 8 Drawing Sheets

MEMORY ACCESS CONTROL SYSTEM AND METHOD

FIELD OF THE DISCLOSURE

The present disclosure is generally related to the field of memory access control, and more particularly to methods and systems for driving a word line of one or more memory cells.

BACKGROUND

Computing systems often include a memory for storing data and other information in the form of bits. The memory typically includes one or more bit cells or memory cells, and each bit cell is operative to store data in the form of a bit. A memory access control system can control the read and write access to the memory for reading data from and writing data to the bit cells.

FIG. 1 illustrates an exemplary known memory access control system 10 including control logic 12 operatively coupled to a memory 14 for controlling access to memory 14 for read/write operations. Control logic 12 includes software and/or firmware code containing instructions executed on one or more programmable processors (e.g. a central processor unit (CPU)), application-specific integrated circuits (ASICs), field-programmable gate arrays (FPGAs), digital signal processors (DSPs), hardwired logic, or combinations thereof. Memory 14 illustratively includes static random access memory (SRAM) 14. Memory 14 includes one or more bit cell arrays 16 each including a plurality of bit cells (i.e., storage cells or memory cells) operative to store data. Each bit cell of bit cell array 16 represents a "bit" of stored data and has two stable states—an off state (e.g., logical "0") and an on state (e.g., logical "1").

Control logic 12 initiates a read or write operation upon receiving a read enable signal 42 or a write enable signal 44, such as from other control logic (e.g. operating system) of a processor, for example. Upon determining that a read/write operation is to be performed, control logic 12 outputs a read/write command 32 to memory 14 to initiate the read/write operation.

A read/write driver 18 is operative to write data to bit cell array 16 and to read data from bit cell array 16 based on control signals provided with control logic 12 via communication bus 40. Read/write driver 18 performs read and write operations on bit cell array 16 over a communication bus 38. In particular, communication bus 38 is connected to one or more bit lines of bit cell array 16 (e.g. see bit lines 72, 74 of FIG. 2) to read and write data with bit cell array 16. Read/write driver 18 includes a software or firmware code stored in a memory accessible by control logic 12, and the code contains instructions executable by control logic 12 for reading and writing data to memory 14. In a read operation, read/write driver 18 pulls data from one or more bit cells of bit cell array 16 over communication bus 38. In a write operation, read/write driver 18 writes data to one or more bit cells of bit cell array 16 by selectively causing individual bit cells of array 16 to change state, thereby writing a bit pattern to the bit cell array 16. In one embodiment, read/write driver 18 and control unit 12 are provided in a single chip device (e.g. a processor device), although read/write driver 18 and control unit 12 may alternatively be provided in separate devices.

Memory 14 includes a word line driver 20 operative to drive a voltage $V_{WL}$ of a word line 30 that controls access to one or more bit cells of bit cell array 16. Memory 14 further includes an internal word line decoder 28 (e.g., address decoder) that receives the write/read command 32 from control unit 12 and, in response, provides an inverted word line signal 34 to word line driver 20 of memory 14. Word line decoder 28 alternatively may be external to memory 14. The inverted word line signal 34, illustratively a voltage signal, causes word line driver 20 to output the word line voltage $V_{WL}$ that enables read/write access to some or all bit cells of bit cell array 16. Word line driver 20, which includes logic circuitry, includes an inverter 22 that inverts the inverted word line signal 34 and outputs a non-inverted word line voltage $V_{WL}$ to bit cell array 16.

FIG. 2 illustrates an exemplary known bit cell 50 (i.e., storage cell or memory cell) of the bit cell array 16 of FIG. 1. Four storage transistors 62, 64, 68, 70 of bit cell 50 are coupled together and cooperate to store a bit of data. Two access or pass-gate transistors 54, 56 are provided to control access to bit cell 50 during read and write operations. Transistors 62, 68 are illustratively positive channel field effect transistors (pFETs), and transistors 54, 56, 64, 70 are illustratively negative channel field effect transistors (nFETs), although other transistor types may be used. Transistors 62, 68 are coupled to a supply voltage $V_{DD}$ of bit cell 50 via electrical conductor 52, and transistors 64, 70 are coupled to ground. Bit cell 50 may have other suitable transistor configurations such as, for example, additional or fewer storage transistors for storing data. In the illustrated embodiment, supply voltage $V_{DD}$ is provided from the main memory voltage of memory 14.

Word line 30 of FIGS. 1 and 2 is an electrical path used to transmit the word line voltage $V_{WL}$ to one or more bit cells (e.g., bit cell 50 of FIG. 2) of bit cell array 16 for controlling access to the one or more bit cells. Referring to bit cell 50 of FIG. 2, word line 30 controls the state of access transistors 54, 56 to enable access to the bit cell 50 for read/write operations. Upon transistors 54, 56 being enabled by word line 30 (i.e., by applying the word line voltage $V_{WL}$), bit cell 50 is electrically connected to bit lines 72, 74 (e.g., electrical conductors) such that the read or write operation can be performed. In particular, write data is provided to bit cell 50 via bit lines 72, 74 during write operations, and data stored at bit cell 50 is read over bit lines 72, 74 during read operations. Bit lines 72, 74 illustratively carry data in the form of a voltage signal that represents logical 0 or 1 (i.e., low or high). While bit cell 50 illustratively includes two bit lines 72, 74 for communicating the data signals BL and BL complement, respectively, a single bit line may be provided in other bit cell configurations.

In operation, upon word line 30 enabling access to bit cell 50 via transistors 54, 56, a read or write operation can be performed via bit lines 72, 74. During a read operation, the stored value Q (e.g., logical 0 or 1) of bit cell 50 stored at node 60 is transferred onto bit line 72, and the inverse of Q stored at node 66 is transferred onto bit line 74. Read/write driver 18 (FIG. 1) then reads the values placed on bit lines 72, 74 via communication bus 38 (FIG. 1). During a write operation, driver 18 places data to be written to bit cell 50 (e.g. logical 0 or 1) on bit lines 72, 74, and bit lines 72, 74 write the data to bit cell 50 at respective nodes 60, 66 upon word line 30 enabling access to bit cell 50 by activating transistors 54, 56.

Word line 30 is operative to enable/disable access to the bit cells 50 of bit cell array 16 (FIG. 1), and a subset of the bit cells 50 of bit cell array 16 may be selected on which to perform the read or write operation. For example, the bit lines (e.g., bit clines 72, 74 of FIG. 2) routed to bit cell array 16 select which bit cells 50 of the array 16 to perform the read/write operation. As such, either a read or write operation may be performed simultaneously on a subset of the bit cells 50 of the array 16. In one embodiment, a read operation may be performed on one subset of bit cells 50 of array 16 on the word line 30 and a write operation may be simultaneously performed on another subset of bit cells 50 of array 16 on the word line 30.

In a typical bit cell 50, the word line voltage $V_{WL}$ of an active word line 30 is set to be substantially equal to the bit cell supply voltage $V_{DD}$. However, such a configuration can lead to instability in the bit cell 50 due to one or more transistors of the bit cell 50 not being able to hold their states. If a bit cell 50 is unstable during a read or write operation, the state (e.g., logical 0 or 1) of the bit cell 50 may undesirably flip or change, resulting in the bit cell 50 being in an erroneous state.

Some methods directed towards improving the stability of a bit cell 50 have been provided to attempt to reduce unintended state changes of the bit cell 50. One known method directed towards improving bit cell stability in a read operation includes reducing or underdriving the word line voltage $V_{WL}$ to a value below $V_{DD}$ during read and write access. Referring again to the exemplary known system 10 of FIG. 1, word line driver 20 is operative to underdrive word line 30 of bit cell array 16 to attempt to improve the read stability of bit cells of the array 16. In particular, word line driver 20 includes an underdrive circuit 26 including a resistive shunt 24 that is operative to drive the word line voltage $V_{WL}$ of bit cell 50 (FIG. 2) to some voltage level below $V_{DD}$. Control logic 12 illustratively controls shunt 24 via underdrive enable signal 36 to enable and disable underdriving the word line voltage $V_{WL}$. When enabled, shunt 24 provides a resistive connection to ground that serves to reduce the likelihood that the output of inverter 22, i.e., voltage $V_{WL}$, reaches the voltage level of the bit cell supply voltage $V_{DD}$. In some systems, the resistance of shunt 24 can be small such that the word line voltage $V_{WL}$ is maintained at a small amount (e.g. 50-100 millivolts) below $V_{DD}$. Shunt 24 can be a transistor device (e.g. transistor 24 of FIG. 4), a resistor, or other suitable resistive device tied to ground.

Referring again to FIG. 2, by underdriving the word line voltage $V_{WL}$ to below $V_{DD}$, the access transistors 54, 56 become weaker because of the reduced voltage at their gates. At the same time, the respective pull-down transistors 64, 70, which can have a full $V_{DD}$ at their gates, become stronger relative to the access transistors 54, 56. As such, the read stability of bit cell 50 can improve because transistors 64, 70, when stronger than respective access transistors 54, 56, are more likely to hold respective values Q and Q-inverse during a read operation without undesirably flipping states.

In some systems, the word line is only underdriven during a read operation and is driven to $V_{DD}$ during a write operation. For example, in the system 10 of FIG. 1, the underdrive shunt 24 may be disabled during a write operation to allow the word line voltage $V_{WL}$ to remain at about $V_{DD}$. However, the half-selected or non-selected bit cells of bit line array 16 can become unstable during the write operation when the word line voltage $V_{WL}$ is at about $V_{DD}$. In particular, during a write operation, often only a subset of the bit cells in bit cell array 16 are written to, as described herein. Half-selected or non-selected bit cells include the bit cells of bit cell array 16 that are not written to during a write operation. These half-selected bit cells of array 16 are thereby electrically configured for a read operation during the write access due to the active word line 30, although read/write driver 18 does not actually read from the half-selected bit cells during the write operation. These half-selected bit cells can become unstable and undesirably change states during the write operation.

For example, referring to FIG. 2, driving the word line voltage $V_{WL}$ at about $V_{DD}$ results in transistors 64, 70 weakening relative to the respective access transistors 54, 56 as compared to underdriving voltage $V_{WL}$ below $V_{DD}$. As such, a half-selected bit cell 50 can become unstable during the write operation because the transistor 64, 70 may not be able to hold the values at nodes 60, 66 during the write operation, resulting in the bit cell flipping or changing state. As such, the bit data stored at the half-selected cells during a write operation may become corrupt due to the word line 30 being at about $V_{DD}$.

Other exemplary methods of attempting to improve bit cell read stability may include raising the supply voltage VDD of the bit cell 50 and reducing a pre-charge of the bit line 72, 74. However, these methods also negatively affect the writability of the bit cell 50, potentially leading to undesired state changes and corrupted data.

An exemplary method of attempting to improve bit cell writability includes coupling the bit line (e.g. bit line 72, 74 of FIG. 2) below ground while the word line 30 is underdriven with shunt 24 of FIG. 1. However, complex logic is required to couple the bit lines below ground, resulting in increased complexity and cost of the word line driver 20. Further, the space occupied by logic circuitry (e.g., the write driver 18, etc.) on the integrated circuit is increased due to significantly more transistors and other components required to implement this method.

Therefore a need exists for methods and apparatuses to simultaneously improve both the read stability and the writability of a bit cell. Further, a need exists for such methods and apparatuses to be cost effective and to require minimal chip space.

SUMMARY OF EMBODIMENTS OF THE DISCLOSURE

In an exemplary embodiment of the present disclosure, a method for controlling access to a memory is provided. The method includes, in response to receiving a write request operative to write data to at least one memory cell of a plurality of memory cells, increasing a word line voltage above a nominal level after a predetermined delay following the receipt of the write request.

Among other advantages, the method and system of the present disclosure simultaneously improves both the read stability and the writability of a bit cell. Another exemplary advantage is that minimal logic circuitry is required to implement the system and method of the present disclosure, thereby limiting cost and required chip space. Other advantages will be recognized by those of ordinary skill in the art.

In one example, the predetermined delay is configured to allow a bit line voltage of at least one memory cell of the plurality of memory cells to decrease to a threshold voltage level prior to increasing the word line voltage. In another example, the threshold voltage level is less than a supply voltage level of the plurality of memory cells. In another example, the nominal level is a supply voltage level of the plurality of memory cells, and the word line voltage is derived from a virtual supply voltage derived from a main memory supply voltage. In yet another example, the word line driver increases the word line voltage above the nominal level after the predetermined delay upon at least one of the virtual supply voltage and the main memory supply voltage being below a threshold voltage level. In still another example, the increasing includes deactivating a word line underdrive circuit operative to drive the word line voltage below the nominal level, and, in response, activating a word line overdrive circuit operative to increase the word line voltage above the nominal level after the predetermined delay. In one example, the increasing further includes disabling a header circuit operative to provide a virtual supply voltage upon deactivating the word line underdrive circuit, the word line voltage being derived from the virtual supply voltage, and enabling a keeper circuit after the predetermined delay upon deactivating the word line underdrive circuit, the keeper circuit being operative to provide the virtual supply voltage.

In another exemplary embodiment of the present disclosure, a method for controlling access to a memory is provided. The method includes, during a write access initiated by a write request, driving a word line voltage below a nominal level. The method further includes, during the same write access, increasing the word line voltage above the nominal level after a predetermined delay following the write request.

In one example, the word line voltage is driven below the nominal level upon receipt of the write request operative to enable the write access. In another example, the method further includes, in response to receiving the write request, increasing the word line voltage substantially to the nominal level after a first predetermined delay and increasing the word line voltage above the nominal level after a second predetermined delay, the second predetermined delay being greater than the first predetermined delay. In yet another example, the first predetermined delay is stored in a word line driver control module and is based on a rate at which a bit line voltage of at least one memory cell decreases to a threshold voltage level, and the second predetermined delay is based on the first predetermined delay.

In yet another exemplary embodiment of the present disclosure, a memory access control system is provided including a word line driver operative to increase a word line voltage above a nominal level during a write access after a predetermined delay in response to a write request operative to cause data to be written to at least one memory cell of a plurality of memory cells. In one example, the word line driver is further operative to drive the word line voltage below the nominal level during the write access in response to receiving the write request. In another example, the predetermined delay is based on a rate at which a voltage of a bit line of at least one memory cell of the plurality of memory cells decreases to a threshold voltage level. In yet another example, the nominal level is a supply voltage level of the plurality of memory cells, and the word line voltage is derived from a virtual supply voltage derived from a main memory supply voltage. In still another example, the word line driver is operative to increase the word line voltage above the nominal level during the write access and after the predetermined delay upon a main memory supply voltage being below a threshold voltage level. In another example, the word line driver comprises a word line underdrive circuit operative to drive the word line voltage below the nominal level during the write access and a word line overdrive circuit operative to increase the word line voltage above the nominal level after the predetermined delay. In this example, the word line underdrive circuit is deactivated and the word line overdrive circuit is activated after the predetermined delay.

In still another exemplary embodiment of the present disclosure, a computer readable medium is provided including executable instructions for execution by an integrated circuit production system such that when executed cause the integrated circuit production system to produce an integrated circuit. The integrated circuit includes a word line driver operative to increase a word line voltage above a nominal level during a write access after a predetermined delay in response to a write request operative to cause data to be written to at least one memory cell of a plurality of memory cells. In one example, the word line driver is further operative to drive the word line voltage below the nominal level during the write access in response to receiving the write request. In another example, the executable instructions are in a hardware description language (HDL) or register-transfer level (RTL) format.

In another exemplary embodiment of the present disclosure, a computer readable medium is provided including data representing a library cell. The library cell includes a word line driver operative to increase a word line voltage above a nominal level during a write access after a predetermined delay in response to a write request operative to cause data to be written to at least one memory cell of a plurality of memory cells.

BRIEF DESCRIPTION OF THE DRAWINGS

The invention will be more readily understood in view of the following description when accompanied by the below figures and wherein like reference numerals represent like elements.

DETAILED DESCRIPTION

Figure 1:
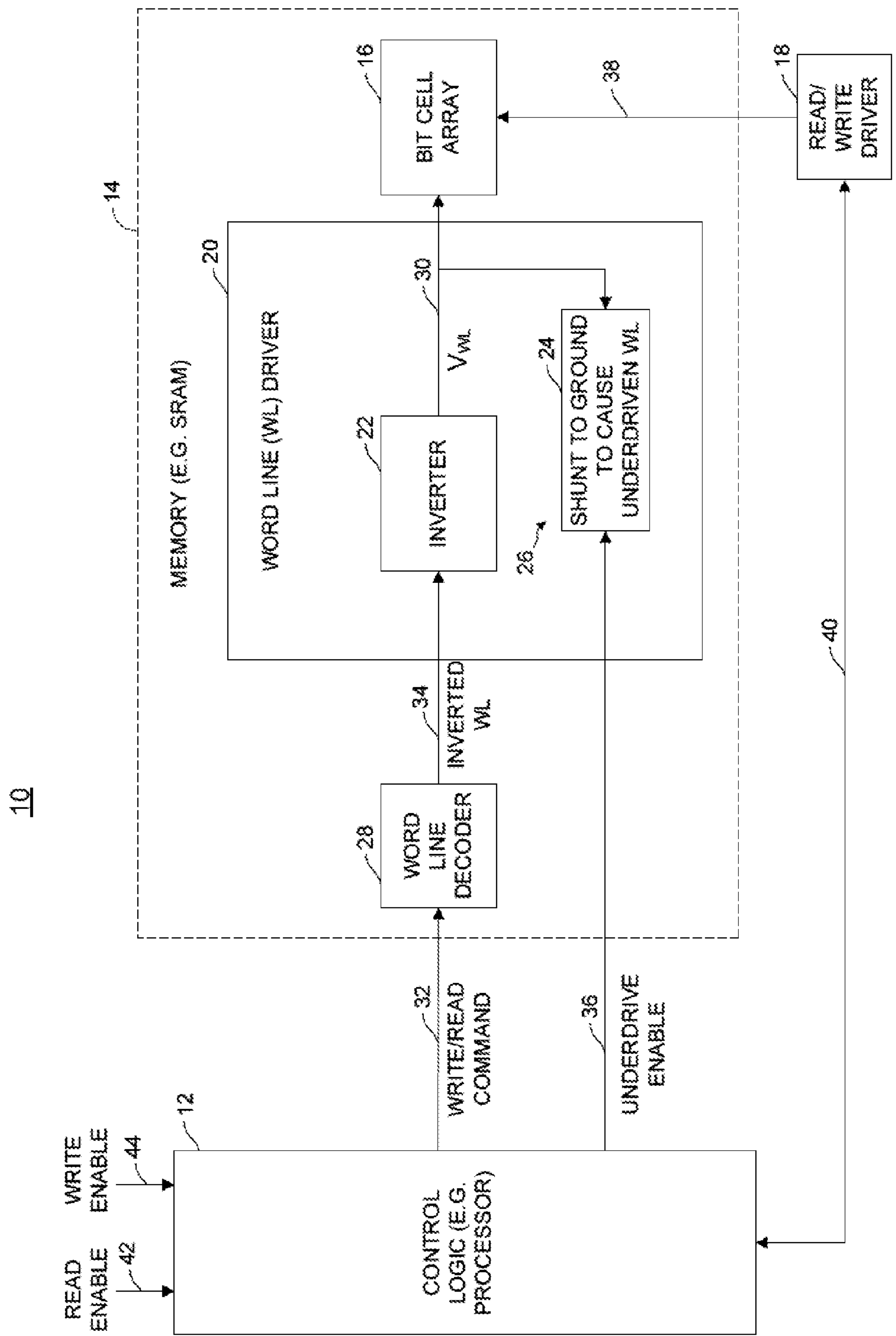
FIG. 1 is a block diagram of an exemplary known memory access control system including an underdrive circuit for underdriving a word line of a bit cell array.

The term “logic” or “control logic” as used herein may include software and/or firmware executing on one or more programmable processors, application-specific integrated circuits (ASICs), field-programmable gate arrays (FPGAs), digital signal processors (DSPs), hardwired logic, or combinations thereof. Therefore, in accordance with the embodiments, various logic may be implemented in any appropriate fashion and would remain in accordance with the embodiments herein disclosed.

The terminology “integrated circuit logic cell” or “logic cell” as used herein is a basic building block of an overall integrated circuit (IC) architecture. That is, “logic cells” as used herein are building blocks (i.e. including multiple transistors, such as 30 to 40 transistors, more or less) that may be stored in a library (also referred to as “standard cell library”) that may be drawn upon to create circuit designs on an IC. An exemplary software code, having executable instructions, used to create such logic cells is hardware description language (HDL). HDL may be used to fabricate integrated circuits by using a plurality of logic cells that may be contained in a library that may be drawn from for IC design and fabrication. Also, “netlist” languages may be used to specify logic cells and corresponding circuit connectivity on computeraided design (CAD) systems. In one example, a logic cell may include 20 transistors, while in a second example a logic cell may include 40 transistors. In yet another example, a logic cell may include 45 transistors or more. Therefore, a logic cell is a building block level of granularity on an IC, where the building block is used to construct a larger functional circuitry on an IC.

The terminology "circuit" and "circuitry" refers generally to hardwired logic that may be implemented using various discrete components such as, but not limited to, diodes, bipolar junction transistors (BJTs), field effect transistors (FETs), etc., which may be implemented on an integrated circuit using any of various technologies as appropriate, such as, but not limited to CMOS, NMOS, etc. Therefore, a "logic cell" may contain various circuitry or circuits.

The term "node" as used herein indicates a connection point within a circuit or circuitry and may be a connection point between discrete components, an input connection point, an output connection point, etc. The node may be more than a connection and may include a discrete component that receives an input signal and changes states in response to the input signal. Therefore, the "node" may include one or more discrete components.

It is to be understood that the terms "high" and "low" (also "on" and "off") are relative to logical values such as respective logical values "1" or "0," which may also be represented as binary "1" or binary "0." The values 1 and 0 are binary values (or logical values) that are normally associated with a logical high (or on) and logical low (or off) as understood by those of ordinary skill.

The terminology "bit cell" or "memory cell" or "storage cell" as used herein indicates a cell of memory that is operative to store information in the form of a bit. The terminology "half-selected" or "non-selected" as used herein in the context of a bit cell (or memory cell or storage cell) refers to a bit cell of a plurality of bit cells (e.g., an array or row of bit cells on the same word line) that is not written to during a write operation to the plurality of bit cells, or to a bit cell of a plurality of bit cells (e.g., an array or row of bit cells on the same word line) that is not read from during a read operation of the plurality of bit cells.

In addition to the components shown in the figures which for the purpose of explaining the principles of the various embodiments herein disclosed, other elements such as additional logic gates, and/or discrete components, etc., may be present in the various specific implementations as may be understood by those of ordinary skill, and such other implementations still remain in accordance with the embodiments herein disclosed.

The various logic circuitry disclosed herein may be described in a form useable by an integrated circuit fabrication or production system. For example, the various logic circuitry disclosed herein may be described in Hardware Description Language (HDL) and may be stored on a computer readable medium/memory. The computer readable medium/memory may be any suitable non-volatile memory such as, but not limited to, programmable chips such as EEPROMS, flash ROM (thumb drives), compact discs (CDs) digital video disks (DVDs), etc., (that may be used to load HDL and/or RTL (register-transfer level), and/or executable instructions or program code), or any other suitable medium so that the HDL, or other suitable data, may be used by various integrated circuit fabrication systems. Therefore, the embodiments herein disclosed include a computer readable medium/memory comprising executable instructions for execution by an integrated circuit production system, that when executed cause the system to produce an integrated circuit comprising at least one integrated circuit logic cell in accordance with the embodiments herein described. The executable instructions may be HDL and/or RTL or any other suitable code and may include code to produce all of the features of the embodiments described above, and also described in further detail herein below.

Figure 3:
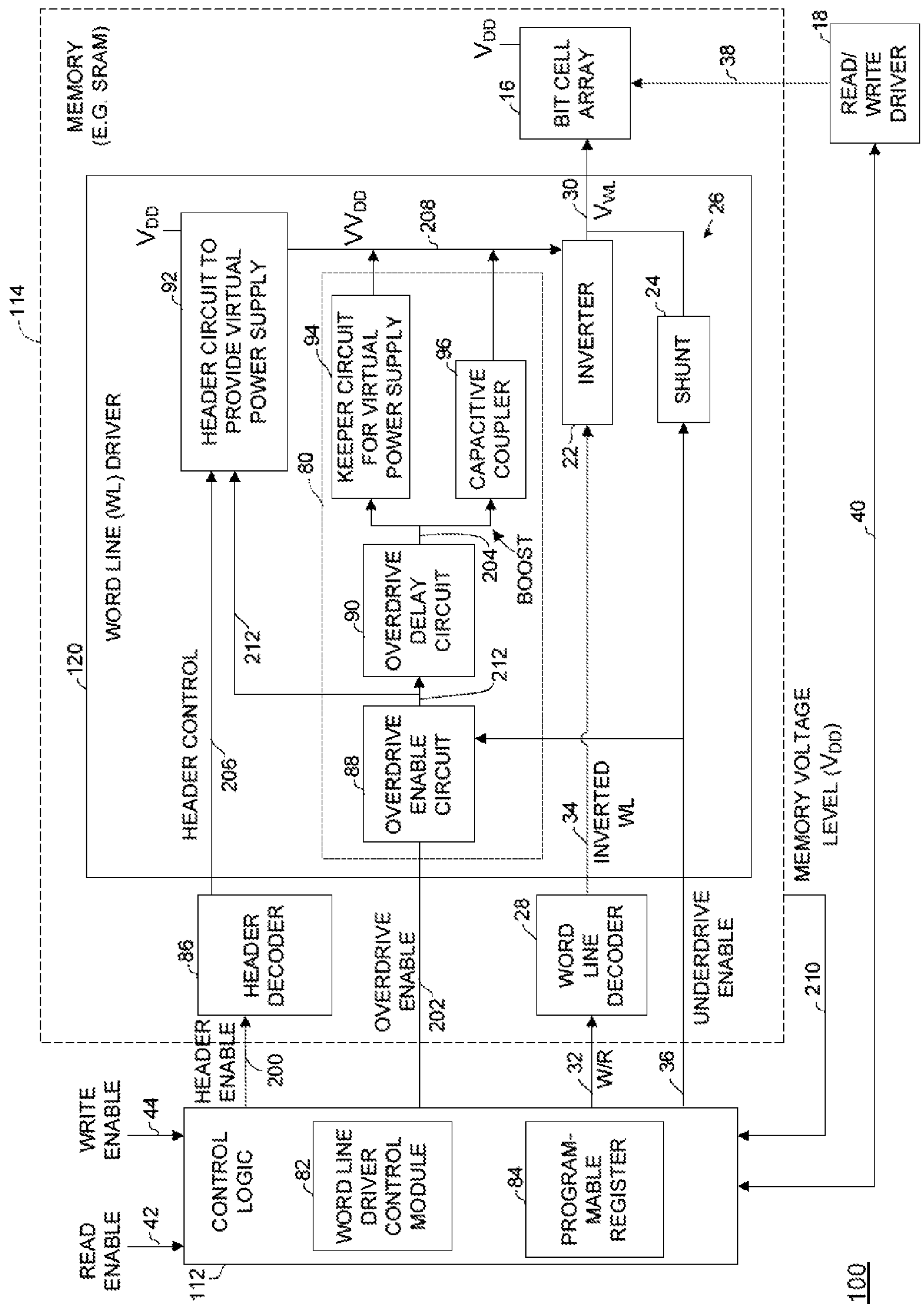
FIG. 3 is a block diagram of a memory access control system in accordance with an embodiment including a word line driver and a word line driver control module configured to simultaneously improve read and writability of a bit cell.

Turning now to the drawings, FIG. 3 illustrates an exemplary memory access system 100 according to various embodiments that is configured to improve the read and writability of memory cells of a memory 114. Memory access control system 100 may be viewed as modifying the known memory access control system 10 described in FIG. 1. For example, control logic 112 of FIG. 3 may be viewed as a modification of the control logic 12 of FIG. 1, and memory 114 and word line driver 120 of FIG. 3 may be viewed as a modification of the memory 14 and word line driver 20 of FIG. 1. Like components of memory access control system 10 of FIG. 1 and memory access control system 100 of FIG. 3 are provided with like reference numbers. Various other arrangements of internal and external components and corresponding connectivity of memory access control system 100, that are alternatives to what is illustrated in the figures, may be utilized and such arrangements of internal and external components and corresponding connectivity would remain in accordance with the embodiments herein disclosed.

Referring to FIG. 3, memory access control system 100 includes control logic 112 operatively coupled to memory 114 (e.g., via a communication bus) for controlling access to one or more bit cell arrays 16 of memory 114 for read/write operations. Memory 114 illustratively includes static random access memory (SRAM) 114, although other suitable memory types may be provided. Memory 114 includes a word line driver 120 having both word line underdrive circuit 26 and a word line overdrive circuit 80 operative to selectively overdrive the word line voltage $V_{WL}$ provided at word line 30, as described herein. Word line driver 120 further includes a header circuit 92 operative to provide a virtual supply voltage $VV_{DD}$ to overdrive circuit 80 and to inverter 22, as described herein. Control logic 112 includes a word line driver control module 82 operative to control word line driver 120 of memory 114. Word line driver control module 82 includes software or firmware code containing instructions that when executed by control logic 112 cause word line driver 120 to selectively underdrive and overdrive the word line 30 during read/write operations of bit cell array 16. In the illustrated embodiment, control logic 112 selectively outputs header enable 200, overdrive enable 202, underdrive enable 36, and read/write command 32 based on instructions from control module 82.

Control logic 112 includes a programmable memory 84, illustratively a programmable register 84, configured to store various control parameters and data used by word line driver control module 82 for controlling word line driver 120. In the illustrated embodiment, register 84 is configured to store a threshold memory operating voltage that is used for enabling and disabling word line overdrive circuit 80 of word line driver 120, as described herein. Register 84 also stores one or more predetermined time delays that are used during control of word line driver 120, as described herein. In one embodiment, control logic 112 provides control signals to memory 114, i.e., header enable 200, overdrive enable 202, underdrive enable 36, and write/read command 32, over a communication bus or other suitable communication interface. Control logic 112 illustratively detects the operating voltage level $V_{DD}$ of memory 114 (and therefore of bit cell array 16) via a feedback line 210 coupled between memory 114 and control logic 112.

Header circuit 92 of word line driver 120 provides a virtual power supply voltage $VV_{DD}$ to the word line 30 of bit cell array 16 to manage the leakage power of word line driver 120. With supply voltage $V_{DD}$ coupled to an input of header circuit 92, the virtual power supply voltage $VV_{DD}$ is derived from supply voltage $V_{DD}$ via header circuit 92. In one embodiment, $VV_{DD}$ is substantially equal to $V_{DD}$. Upon receiving a read or write enable signal 42, 44 and determining that a read or write operation is to be performed, control logic 112 outputs a header enable signal 200 to header decoder 86 of memory 114 to initiate the activation of header circuit 92. In response, header decoder 86, such as an address decoder 86 for example, outputs header control signal 206 to header circuit 92. In the illustrated embodiment, header circuit 92 is enabled based on header control signal 206 and on a signal 212 output by overdrive circuit 80, as described herein. Header decoder 86 is internal to memory 114, but may alternatively be external to memory 114. Upon being enabled, header circuit 92 outputs the virtual supply voltage $VV_{DD}$ to inverter 22 via electrical line 208. With $VV_{DD}$ as an input, inverter 22 outputs the word line voltage $V_{WL}$ to bit cell array 16. As such, $V_{WL}$ is derived from virtual supply voltage $VV_{DD}$, which is derived from $V_{DD}$. In one embodiment, header circuit 92 is coupled to a plurality of word line drivers 120 to provide $VV_{DD}$ to multiple word lines 30.

In one embodiment, control logic 112 outputs header enable signal 200 to turn on the virtual supply $VV_{DD}$ of header circuit 92 only when word line 30 is activated. As such, while word line 30 is active, virtual supply $VV_{DD}$ is also active to save leakage power. Header circuit 92 may be turned off with signal 200 to turn off the virtual supply $VV_{DD}$ when the word line 30 is not active (i.e., when a read/write operation is not being performed).

Referring still to FIG. 3, word line overdrive circuit 80 of word line driver 120 is operative to drive the word line voltage $V_{WL}$ to a level above the supply voltage $V_{DD}$ supplied to bit cell array 16. As described herein, control logic 112 is configured to deactivate underdrive circuit 26 and to activate overdrive circuit 80 after a predetermined delay during a write access to bit cell array 16. As described herein, the predetermined delay is configured to allow a bit line voltage of one or more half-selected cells of array 16 to fall sufficiently below the voltage supply $V_{DD}$ such that a boost of virtual supply $VV_{DD}$ does not adversely affect the read stability of half selected bit cells. Overdrive circuit 80 illustratively includes an overdrive enable circuit 88, an overdrive delay circuit 90, a keeper circuit 94, and a capacitive coupler 96.

Overdrive enable circuit 88 is operative to turn off header 92 upon control logic 112 deactivating the word line underdrive circuit 26 and enabling the word line overdrive circuit 80. In particular, when underdrive circuit 26 is turned off, i.e., when underdrive enable 36 is deactivated, overdrive enable circuit 88 outputs signal 212 to thereby deactivate header circuit 92. As such, $VV_{DD}$ is shut off when the word line overdrive circuit 80 is activated.

Signal 212 is also provided to overdrive delay circuit 90, which in turn outputs a boost signal 204 after a predetermined delay following the activation of overdrive circuit 80. Boost signal 204 serves to boost virtual supply voltage $VV_{DD}$, which in turn overdrives voltage $V_{WL}$ of word line 30 above supply voltage $V_{DD}$. As such, overdrive delay circuit 90 serves to delay the boost signal 204 from reaching capacitive coupler 96 and keeper circuit 94, thereby delaying the overdriving of word line 30. In one embodiment, overdrive delay circuit 90 delays the transmission of boost signal 204 to capacitive coupler 96 to allow header circuit 92 and shunt 24 to shut off before the boost signal 204 boosts $VV_{DD}$. As such, overdrive delay circuit 90 serves to isolate $VV_{DD}$ from $V_{DD}$ (coupled to header circuit 92) before the boost of $VV_{DD}$ is performed.

Capacitive coupler 96 of FIG. 3 is activated with the boost signal 204 provided with overdrive delay circuit 90. Upon being activated, the output of capacitive coupler 96 serves to boost $VV_{DD}$ to a higher voltage level, which in turn overdrives the word line 30. Capacitive coupler 96 also serves as a capacitor to slow the rate at which the voltage level of $VV_{DD}$ decreases towards ground (i.e., zero) while the overdrive circuit 80 is active. As described herein, header circuit 92 is deactivated upon overdrive circuit 80 being activated. As such, the voltage level of virtual supply $VV_{DD}$ will begin to drop upon header circuit 92 being deactivated due to device leakage, and the enabled capacitive coupler 96 serves to limit or reduce the rate at which virtual supply $VV_{DD}$ decays towards zero.

Keeper circuit 94 of FIG. 3 is operative to hold the virtual supply voltage $VV_{DD}$ above ground while overdrive circuit 80 overdrives word line 30. Keeper circuit 94 receives the boost signal 204 provided with overdrive delay circuit 90. With header 92 disabled, keeper circuit 94 is activated to reduce the likelihood of $VV_{DD}$ leaking back down to ground due to device leakage, i.e., because header circuit 92 is no longer active to hold $VV_{DD}$ high. With boost signal 204 provided to keeper circuit 94, keeper circuit 94 is configured to activate upon $VV_{DD}$ falling below $V_{DD}$ by a certain amount. In the illustrated embodiment, keeper circuit 94 includes a transistor (see of FIG. 4) tied to $V_{DD}$ that is activated to hold $VV_{DD}$ above ground when $VV_{DD}$ decreases below $V_{DD}$ by the threshold voltage ($V_T$) of the transistor. In other words, keeper circuit 94 is activated when $VV_{DD}$ is about equal to ($V_{DD}-V_T$). In the illustrated embodiment, both header circuit 92 and shunt 24 are fully deactivated prior to enabling keeper circuit 94.

Figure 4:
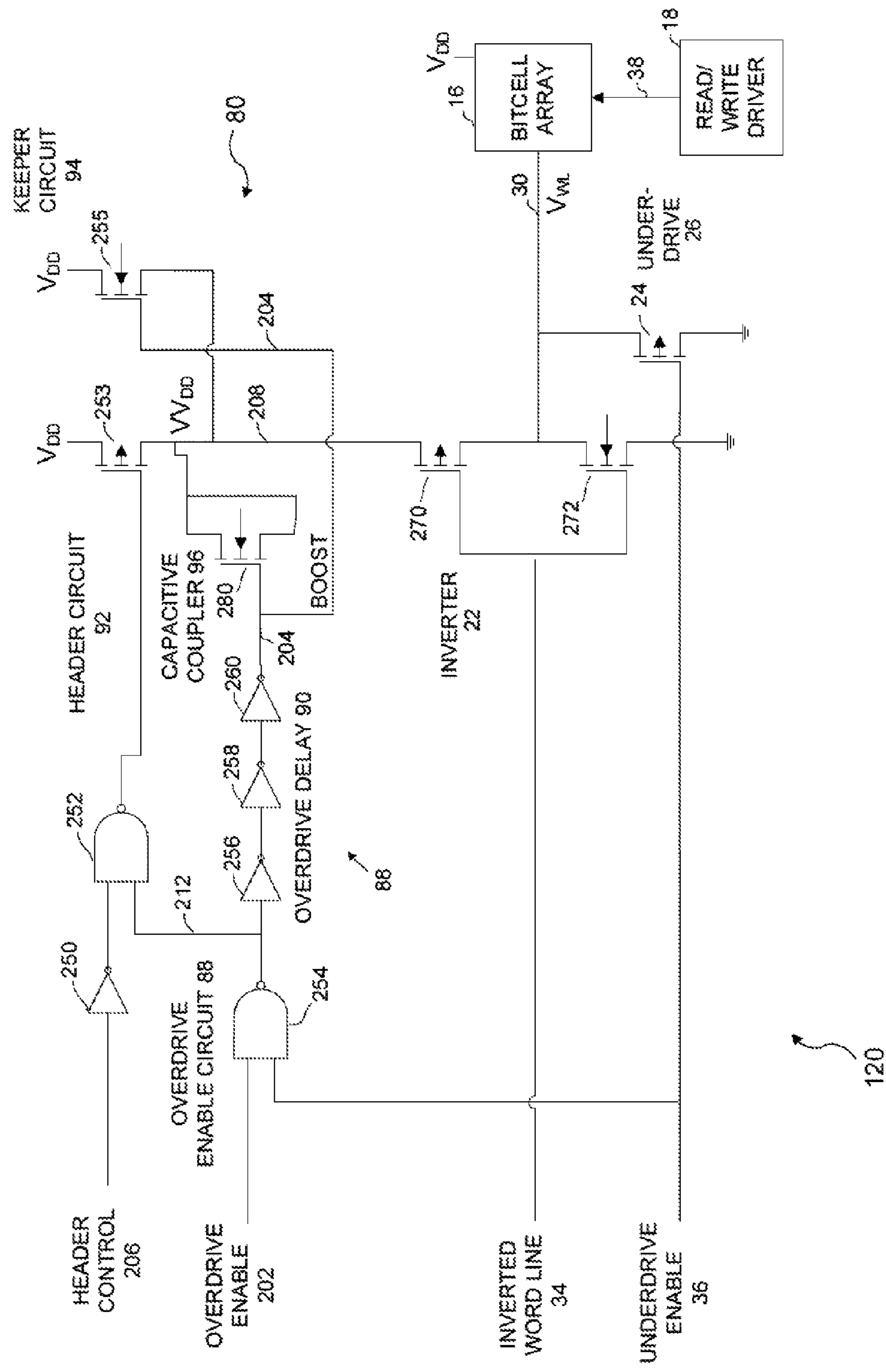
FIG. 4 is an exemplary schematic diagram of the word line driver of FIG. 3.

FIG. 4 illustrates an exemplary word line driver 120 of FIG. 3 according to one embodiment. Referring first to exemplary inverter 22 and underdrive circuit 26 of FIG. 4, a pair of transistors 270, 272 serve as inverter 22 and a transistor 24 serves as resistive shunt 24 of underdrive circuit 26. Transistors 270, 272, illustratively a pFET 270 and an nFET 272, cooperate to receive the inverted word line signal 34 from decoder 28 (FIG. 3) and to output the word line voltage signal $V_{WL}$ to word line 30. As such, the inverted word line signal 34 serves as a read/write request to word line driver 120 to activate word line 30. When enabled with underdrive enable 36, transistor 24 serves as a resistive shunt that couples word line 30 to ground to underdrive the word line voltage $V_{WL}$ (i.e., drive below $V_{DD}$), as described herein. Transistor 24 is illustratively a pFET such that when underdrive enable 36 is logic 0, transistor 24 is activated to underdrive word line 30. Transistor 24 is disabled upon underdrive enable 36 going to logic 1, thereby disabling the underdrive of word line 30 and allowing word line 30 to be driven at about the supply voltage $V_{DD}$. Other suitable configurations of inverter 22 and word line underdrive circuit 26 may be provided.

Exemplary header circuit 92 of FIG. 4 includes a transistor 253 coupled between voltage supply $V_{DD}$ and inverter 22. When enabled, transistor 253 supplies the virtual supply voltage $VV_{DD}$ to transistor 270 of inverter 22 such that $VV_{DD}$ drives the word line voltage $V_{WL}$. As such, virtual supply voltage $VV_{DD}$ is derived from the supply voltage $V_{DD}$ via transistor 253, and word line voltage $V_{WL}$ is derived from the virtual supply voltage $VV_{DD}$ (and from $V_{DD}$). Transistor 253 is illustratively a pFET, although other suitable types may be used. Header circuit 92 further includes an inverter 250 coupled to an input of a NAND gate 252. When header control signal 206 is logic 0, the output of inverter 250 is logic 1. NAND gate 252 outputs a low signal (i.e., logic 0) operative to activate transistor 253 when the output of inverter 250 and the signal 212 from overdrive circuit 80 are both logic 1. With transistor 253 enabled, header circuit 92 is activated to provide the virtual supply $VV_{DD}$ to inverter 22 for driving word line 30. Other suitable configurations of header circuit 92 may be provided.

Referring to the exemplary overdrive circuit 80 of FIG. 4, an exemplary overdrive enable circuit 88 includes a NAND gate 254 that receives as input overdrive enable signal 202 and the underdrive enable signal 36 from control logic 112. The output of NAND gate 254 passes through the overdrive delay circuit 90 illustratively including three inverters 256, 268, 260 arranged in series. Inverters 256, 258, 260 cooperate to delay the boost signal 204 from reaching capacitive coupler 96 until header circuit 92 is deactivated, as described herein, as well as to invert the output of NAND gate 254 as the boost signal 204. Fewer or additional inverters, or other suitable circuit components, may be provided in overdrive delay circuit 90 to delay the boosting of $VV_{DD}$ until header circuit 92 is deactivated. When both overdrive enable 202 and underdrive enable 36 are logic 1 (i.e., when control logic 112 enables boost and disables underdrive shunt 24), the output of NAND gate 254 is logic 0 and the output of overdrive delay circuit 90 (i.e., boost 204) is logic 1, thereby enabling capacitive coupler 96 and keeper circuit 94. NAND gate 254 allows the overdrive of word line 30 to be disabled upon removing overdrive enable signal 202.

An exemplary keeper circuit 94 illustrated in FIG. 4 includes a transistor 255 coupled to the boost signal 204 and the virtual power supply $VV_{DD}$. When boost 204 is enabled and $VV_{DD}$ drops to about ($V_{DD}-V_T$), transistor 255 is enabled to thereby hold $VV_{DD}$ above ground (i.e., due to $V_{DD}$ being coupled to transistor 94). In one embodiment, transistor 255 is a diode connected nFET, although other suitable configurations of keeper circuit 94 may be provided. In one embodiment, an enabled transistor 255 holds $VV_{DD}$ at a voltage level approximately equal to $V_{DD}$ less the transistor threshold voltage $V_T$. In one embodiment, $VV_{DD}$ begins to leak down towards ground as soon as $VV_{DD}$ is boosted with boost signal 204. Transistor 255 serves to keep $VV_{DD}$, and therefore word line 30, above ground or zero throughout the read or write operation until the word line 30 is disabled.

Exemplary capacitive coupler 96 of FIG. 4 illustratively includes a transistor 280 (e.g., nFET) that is coupled to boost signal 204 at its gate and $VV_{DD}$ at its source and drain. The transistor 280, illustratively tied as a capacitor, serves to boost $VV_{DD}$ to a higher voltage level for overdriving word line 30. Transistor 280 also functions as a capacitor to reduce the voltage decay rate of $VV_{DD}$, as described herein. Alternatively, a capacitor or other suitable component(s) may be provided for capacitive coupler 96.

Referring to FIGS. 3 and 4, overdrive enable 202 provided by control logic 112 is operative to activate and deactivate the overdrive circuit 80 of word line driver 120. In an alternative embodiment, NAND gate 254 of FIG. 4 is replaced with an inverter having only underdrive enable 36 as its input (with overdrive enable 202 removed). As such, upon the resistive shunt 24 being disabled (i.e., upon underdrive enable 36 being set to logic 1), the overdrive circuit 80 is activated with underdrive enable 36. After a delay following activation, overdrive circuit 80 overdrives the word line 30, as described herein. Other suitable configurations of overdrive enable circuit 80 may be provided.

In one embodiment, overdrive circuit 80 is activated to overdrive the word line 30 during write operations and is not activated during read operations. In another embodiment, overdrive circuit 80 is activated to overdrive the word line 30 during low-voltage write operations and is not activated during read operations or during high-voltage write operations. In particular, when the operating voltage $V_{DD}$ of memory 114 (or the virtual supply voltage $VV_{DD}$ at line 208) is already at a high voltage level during a write operation, the likelihood of the bit cells of array 16 being unstable or unwritable during the write operation may be reduced. Control module 82 of control logic 112 illustratively detects the operating voltage level $V_{DD}$ of main memory 114 (or $VV_{DD}$) via feedback line 210 of FIG. 3. Upon $V_{DD}$ being greater than a threshold voltage level (i.e., stored at register 84) during a write operation, control module 82 deactivates overdrive enable 202 to thereby prevent or deactivate the operation of the overdrive circuit 80 during the write operation. Similarly, upon control module 82 receiving a write enable signal 44 and determining that voltage $V_{DD}$ (detected via feedback line 210) is less than the threshold voltage level stored at register 84, control module 82 activates the overdrive circuit 80 of word line driver 120 to overdrive the word line voltage $V_{WL}$ during the write operation, as described herein. In one embodiment, the threshold voltage level of $V_{DD}$ stored at register 84 is about 0.8 volts, although other suitable threshold levels may be provided.

Figure 2:
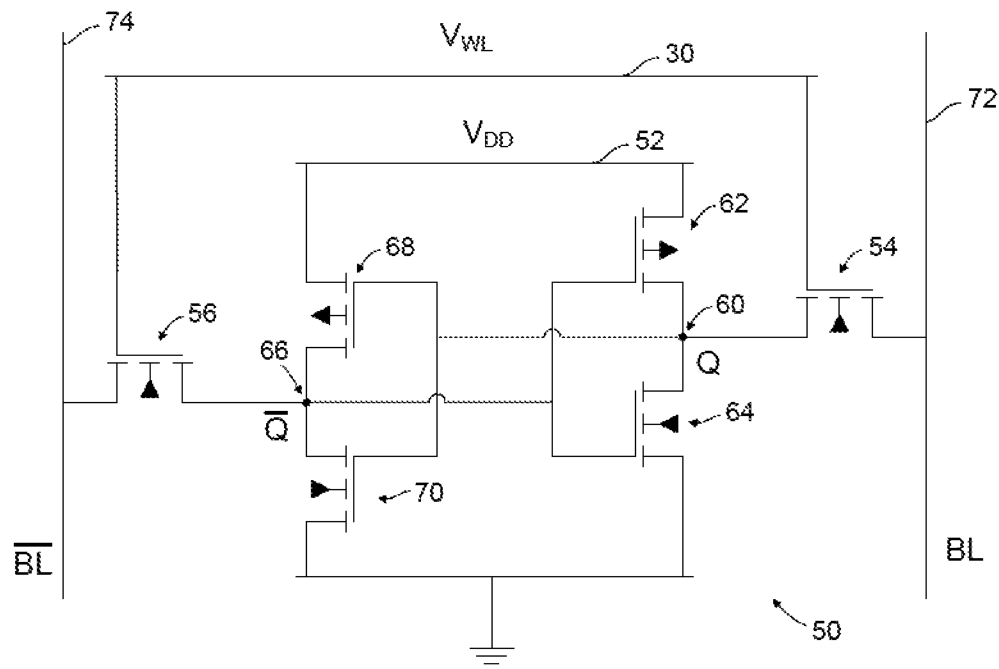
FIG. 2 is a schematic diagram of an exemplary known bit cell including a word line for accessing the bit cell and a bit line for reading and writing data.
Figure 5:
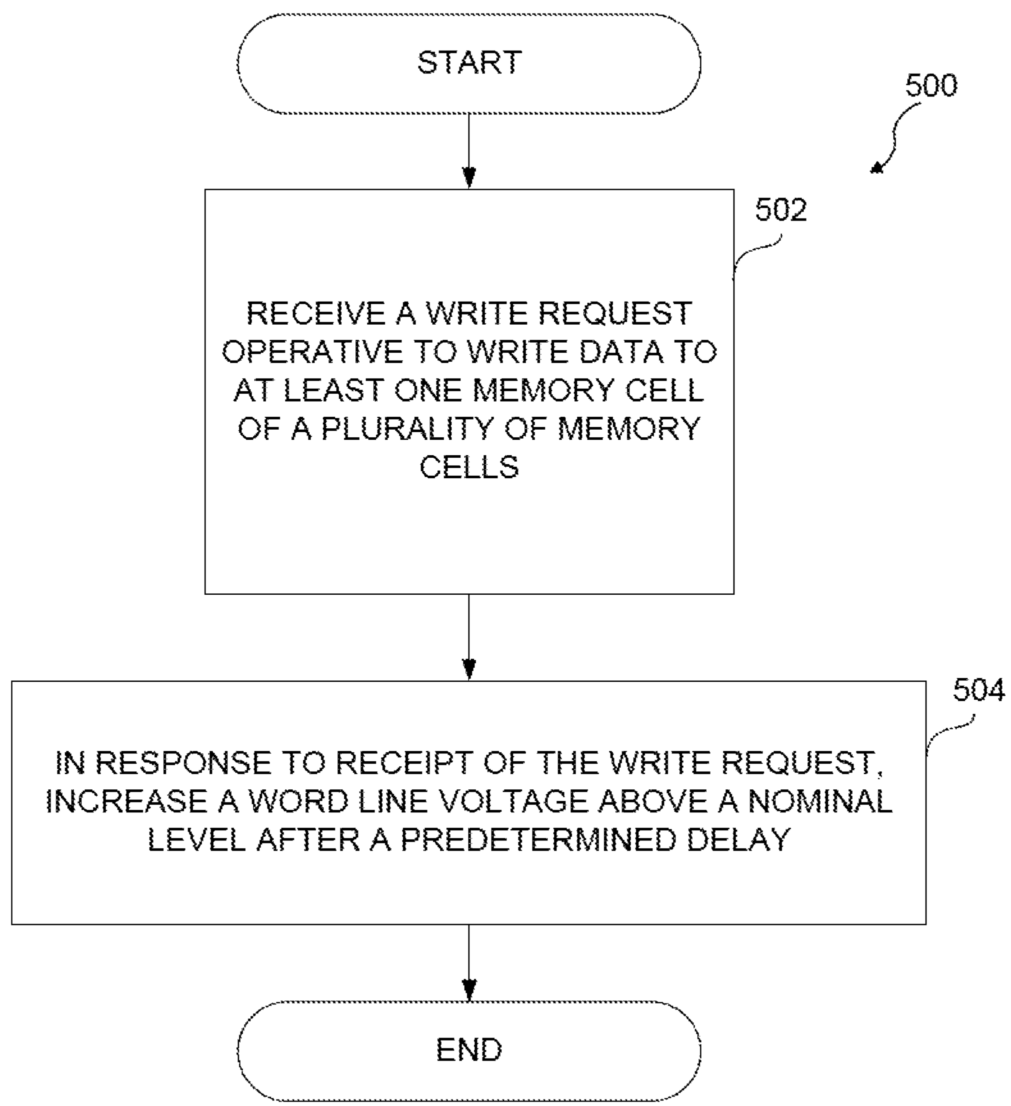
FIG. 5 is a flow chart of an exemplary method of operation for driving a word line of at least one bit cell.

FIG. 5 illustrates a flow diagram 500 of an exemplary operation performed by memory access control system 100 of FIG. 3 for driving the word line voltage $V_{WL}$. At block 502, a write request is received that is operative to write data to at least one memory cell (e.g. bit cell 50 of FIG. 2) of a plurality of memory cells (e.g., bit cell array 16 of FIG. 3). At block 504, in response to receipt of the write request at block 502, a word line voltage $V_{WL}$ is increased above a nominal level, such as above the voltage level of supply voltage $V_{DD}$, after a predetermined delay following receipt of the write request. As described herein, supply voltage $V_{DD}$ provides power to the bit cells of bit cell array 16. In one embodiment, supply voltage $V_{DD}$ is the main memory voltage of memory 114 that is supplied to one or more bit cell arrays 16 and word line drivers 120 of memory 114.

In one embodiment, word line driver control module 82 of control logic 112 receives a write request at block 502 via write enable 44, and, in response, increases the word line voltage $V_{WL}$ above the supply voltage $V_{DD}$ by activating the word line overdrive circuit 80 of word line driver 120 after the predetermined delay stored in register 84. As described herein, the predetermined delay stored at register 84 is based on a rate at which the voltage of a bit line of at least one half-selected bit cell of array 16 decreases to a threshold level. In the illustrated embodiment, the threshold level corresponds to a bit line voltage operative to reduce the likelihood of half-selected cells of bit cell array 16 becoming unstable during the write operation.

In one embodiment, the word line 30 is driven below the supply voltage $V_{DD}$ prior to activating the word line overdrive circuit 80 to overdrive word line 30.

In one embodiment, word line driver 120 receives a write request via the inverted word line signal 34 provided with word line decoder 28, and, in response, increases the word line voltage $V_{WL}$ above the supply voltage $V_{DD}$ by boosting the virtual supply voltage $VV_{DD}$ after the predetermined delay provided with overdrive delay circuit 90. In other words, the word line voltage $V_{WL}$ is increased above $V_{DD}$ after a predetermined delay following the assertion of word line 30. As described herein, the predetermined delay provided with overdrive delay circuit 90 allows header circuit 92 and shunt 24 to deactivate before the boost signal 204 boosts $VV_{DD}$ (and thus overdrives $V_{WL}$). As such, the predetermined delay of block 504 of FIG. 5 may include the delay stored at register 84 of control logic 112 or the delay provided with overdrive delay circuit 90 or both.

Figure 6:
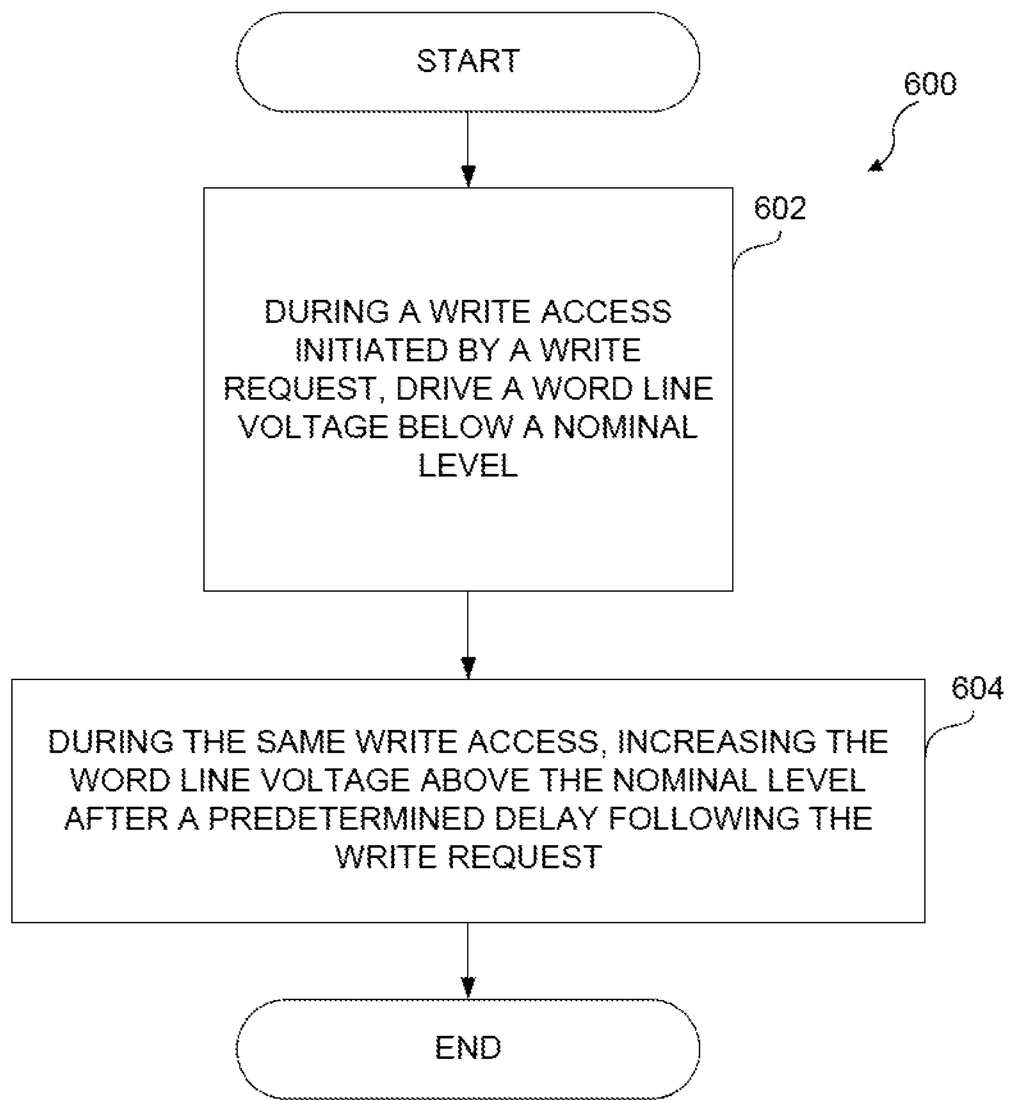
FIG. 6 is a flow chart of another exemplary method of operation for driving a word line of at least one bit cell.

FIG. 6 illustrates a flow diagram 600 of another exemplary operation for driving the word line voltage $V_{WL}$ performed by memory access control system 100 of FIG. 3. At block 602, during a write access of bit cell array 16 that is initiated by a write request, the word line voltage $V_{WL}$ of one or more bit cells of bit cell array 16 is driven below a nominal level, such as below the voltage level of supply voltage $V_{DD}$. In one embodiment, word line voltage $V_{WL}$ is driven below the nominal level upon receipt of the write request (e.g., write enable 44, read/write command 32) operative to enable the write access. At block 604, during the same write access, the word line voltage $V_{WL}$ is increased above the nominal level (e.g., $V_{DD}$) after a predetermined delay following the write request. As described above with respect to FIG. 5, the predetermined delay of block 604 may include the delay stored at register 84 of control logic 112 or the delay provided with overdrive delay circuit 90 or both.

In one embodiment, the write access is enabled upon control module 82 receiving the write enable signal 44 and outputting the read/write command 32 to activate the word line 30 (via inverter 22 of FIG. 4). In one embodiment, the write access completes when control module 82 deactivates the word line 30 by removing the read/write command 32 (or the inverted word line signal 34).

In one embodiment, in response to receiving the write request, word line driver 120 increases the word line voltage $V_{WL}$ substantially to the nominal level (e.g., $V_{DD}$) after a first predetermined delay and increases the word line voltage $V_{WL}$ above the nominal level after a second predetermined delay. In one embodiment, the second predetermined delay is greater than the first predetermined delay. For example, the first predetermined delay is the delay stored at register 84 of control module 82 and is based on the time required for a bit line voltage to fall sufficiently below the voltage supply $V_{DD}$, as described herein. The second predetermined delay includes the first predetermined delay and is further based on the delay implemented by overdrive delay circuit 90, which is activated after passage of the first predetermined delay (e.g., with signals 36, 202).

Figure 7:
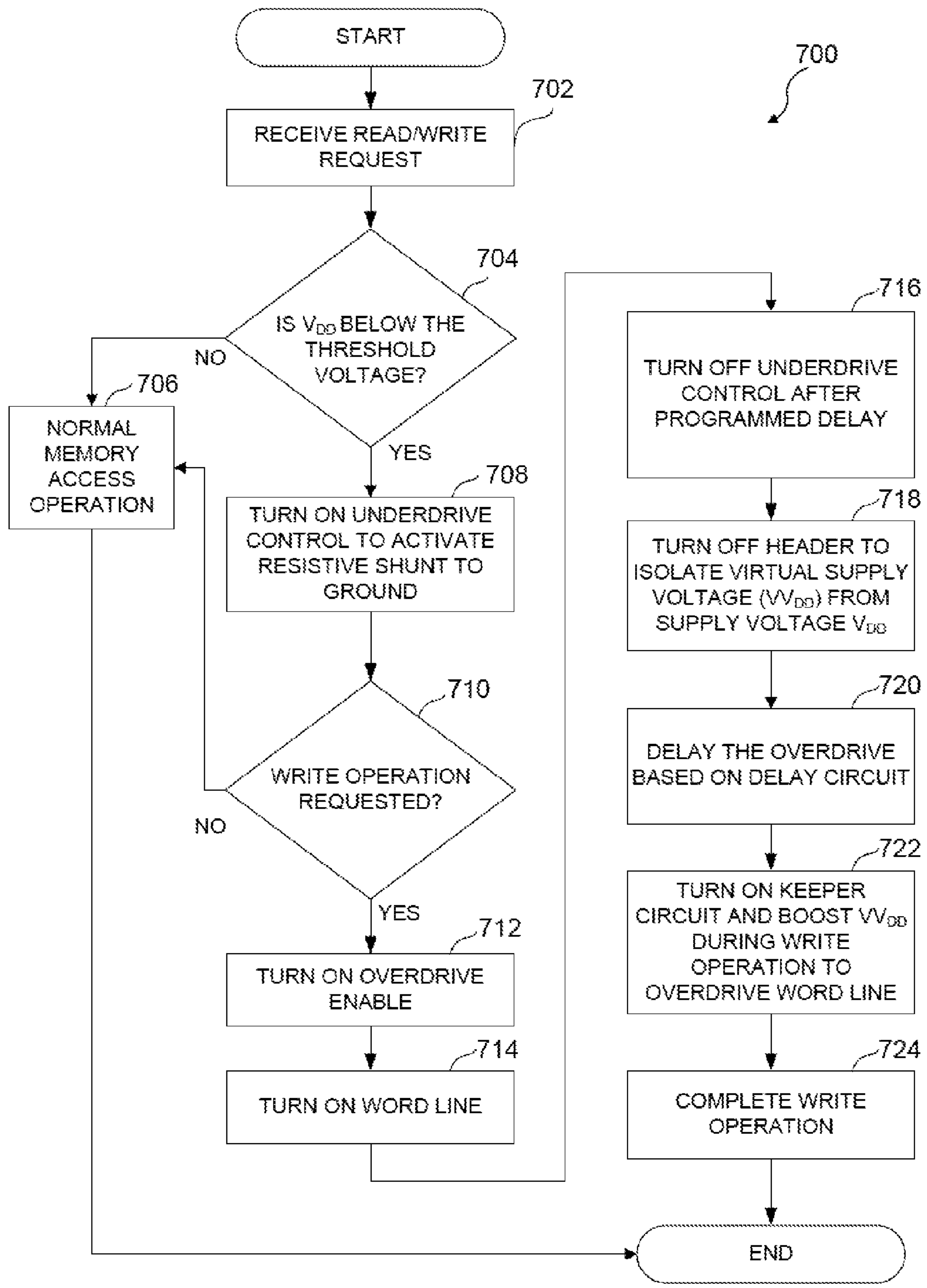
FIG. 7 is a flow chart of an exemplary method of operation of the word line driver control module and word line driver of FIG. 3.

FIG. 7 illustrates a flow diagram 700 of an exemplary operation performed by word line driver control module 82 and word line driver 120 of FIG. 3 for driving the word line voltage $V_{WL}$. Reference is made to FIGS. 3 and 4 and to the exemplary word line voltage $V_{WL}$ of FIG. 8 throughout the following description of FIG. 7.

At block 702 of FIG. 7, control module 82 receives a read or write request via read/write enable signals 42, 44. At block 704, control module 82 determines if at least one of the main memory supply voltage $V_{DD}$ and the virtual supply voltage $VV_{DD}$ detected via feedback line 210 is below a threshold voltage. As described herein, the threshold voltage is stored at register 84 and is illustratively based on a voltage level above which half-selected bit cells are less likely to be unstable. An exemplary threshold voltage is about 0.8 V. Control module 82 illustratively compares the supply voltage $V_{DD}$ to the threshold voltage stored at register 84 at block 704. If $V_{DD}$ is above the threshold, control module 82 performs a normal memory access operation at block 706, i.e., does not activate overdrive circuit 80 during the read/write operation. For example, a normal memory access may include driving the word line 30 at about $V_{DD}$ during a read or write operation or underdriving the word line below $V_{DD}$ during a read operation.

If $V_{DD}$ is below the threshold at block 704, control module 82 proceeds to turn on underdrive control via underdrive enable signal 36 to activate resistive shunt 24 such that the word line driver 120 is configured to underdrive the word line 30. At block 710, control module 82 determines if a write operation is requested, and if yes, control module 82 proceeds to turn on the overdrive enable signal 202 at block 712 such that the overdrive circuit 80 is configured to activate upon underdrive enable 36 being deactivated. If a read operation is requested (e.g. read enable signal 42 received) at block 710, control module 82 proceeds with a normal memory access operation at block 706, as described above.

At block 714, control module 82 turns on word line 30 by issuing a read/write command 32 to memory 114. Word line decoder 28 receives the command 32 and outputs the inverted word line signal 34 to inverter 22 to thereby activate the word line 30. As such, referring to FIG. 8, word line voltage $V_{WL}$ increases to a first level below $V_{DD}$ at time A with underdrive enable 36 activated at block 708.

Figure 8:
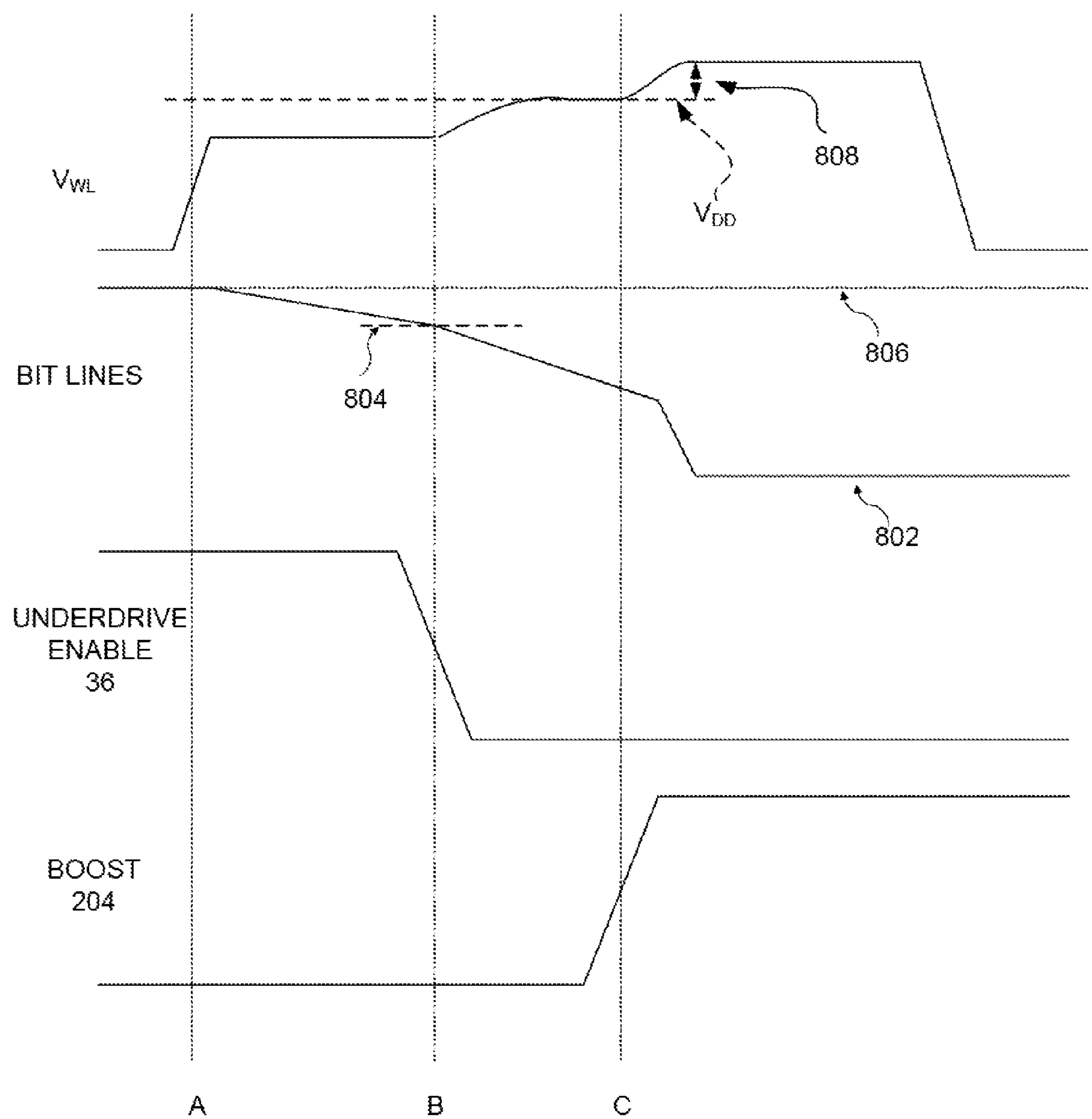
FIG. 8 is a graph illustrating an exemplary word line voltage $V_{WL}$ provided with the word line driver of FIG. 3 according to an embodiment.

At block 716 of FIG. 7, control module 82 deactivates the underdrive circuit 26 (i.e., shunt 24) after a predetermined delay stored at register 84. As described herein, the predetermined delay is based on the decay rate of a bit line voltage provided to one or more half-selected bit cells of array 16. Referring to FIG. 8, module 82 deactivates underdrive circuit 26 at time B by removing underdrive enable 36. As such, the predetermined delay is illustratively defined as from time A to time B of FIG. 8. In FIG. 8, line 802 represents the bit line voltage (e.g. voltage of bit line 72 of FIG. 2) and line 806 represents the voltage of bit line complement (e.g., voltage of bit line 74 of FIG. 2), which is illustratively equal to about $V_{DD}$. At time B, the bit line voltage 802 has decreased below line 806 (i.e., below $V_{DD}$) to a threshold voltage level 804. In the illustrated embodiment, the threshold level 804 is such that half-selected bit cells of array 16 are less likely to become unstable during a write operation with the word line voltage $V_{WL}$ at or above $V_{DD}$. For example, allowing the bit line voltage 802 to decrease to threshold level 804 is configured to provide read stability to the half-selected cells of bit cell array 16 during a write operation before the word line voltage $V_{WL}$ returns to and exceeds $V_{DD}$. As such, the predetermined delay between times A and B is determined based on the time or rate at which the bit line voltage 802 decreases to threshold voltage level 804 after activating the word line 30 at time A.

Upon deactivating the underdrive circuit 26 at block 716 of FIG. 7, control module 82 activates the overdrive circuit 80 to initiate the operations of blocks 718, 720, 722, and 724. At block 718, header circuit 92 is disabled (i.e., with signal 212) to isolate the virtual supply voltage $VV_{DD}$ from the supply voltage $V_{DD}$, as described herein. At block 720, word line driver 120 delays overdriving word line 30 based on the configuration of overdrive delay circuit 90, as described herein. At block 722, after delaying the overdrive, word line driver 120 activates keeper circuit 94 and boosts the virtual supply voltage $VV_{DD}$ to thereby overdrive the word line voltage $V_{WL}$ above $V_{DD}$. For example, referring to FIG. 8, upon removing underdrive enable 36 at time B, control module 82 activates the overdrive circuit 80 and causes header circuit 92 to deactivate. With underdrive disabled, the word line voltage $V_{WL}$ increases to $V_{DD}$ between times B and C. Boost delay circuit 90 delays the overdrive until time C, at which time boost signal 204 is provided to keeper circuit 94 and to capacitive coupler 96 to boost $VV_{DD}$ and thereby overdrive $V_{WL}$. As such, the delay provided with boost delay circuit 90 is illustratively between times B and C of FIG. 8. As illustrated in FIG. 8, the word line voltage $V_{WL}$ increases above $V_{DD}$ by amount 808 after time C due to the boost signal 204 provided to $VV_{DD}$.

At block 724 of FIG. 7, the write operation completes, upon which control module 82 may deactivate the write/read command 32 and boost enable 202. The write operation completes with the bit line completing the transfer of data to the bit cell (e.g., bit cell 50 of FIG. 2). As illustrated in FIG. 8, the bit line voltage 802 continues to decrease from time A to time B as data is written to the bit cell. At time C, overdrive is enabled, and the bit line completes the transfer of data to the bit cell as illustrated by the bit line voltage 802 decreasing to zero. By coupling the word line voltage $V_{WL}$ above $V_{DD}$ at time C, the write operation is able to complete with greater stability without negatively affecting the stability of the half-selected bit cells of array 16. As such, boost 204 is operative to elevate $V_{WL}$ above $V_{DD}$ by an amount 808 configured to increase the writability of the bit cell(s).

Among other advantages, the method and system of the present disclosure simultaneously improves both the read stability and the writability of a bit cell. Another exemplary advantage is that minimal logic circuitry is required to implement the system and method of the present disclosure, thereby limiting cost and required chip space. Other advantages will be recognized by those of ordinary skill in the art.

While this invention has been described as having preferred designs, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this disclosure pertains and which fall within the limits of the appended claims.

What is claimed is:

1. A method for controlling memory access comprising:

in response to receiving a write request operative to write data to at least one memory cell of a plurality of memory cells, increasing a word line voltage above a nominal level after a predetermined delay following the receipt of the write request, wherein the word line voltage is increased above the nominal level after the predetermined delay based on a supply voltage level of the plurality of memory cells being below a threshold supply voltage level.

2. The method of claim 1, wherein the predetermined delay is configured to allow a bit line voltage of at least one memory cell of the plurality of memory cells to decrease to a threshold voltage level prior to increasing the word line voltage.

3. The method of claim 2, wherein the threshold voltage level is less than the supply voltage level of the plurality of memory cells.

4. The method of claim 1, wherein the nominal level is the supply voltage level of the plurality of memory cells and wherein the word line voltage is derived from a virtual supply voltage derived from a main memory supply voltage.

5. The method of claim 1, wherein the increasing comprises:

deactivating a word line underdrive circuit operative to drive the word line voltage below the nominal level; and in response, activating a word line overdrive circuit operative to increase the word line voltage above the nominal level after the predetermined delay.

6. The method of claim 5, wherein the increasing further comprises:

disabling a header circuit operative to provide a virtual supply voltage upon deactivating the word line underdrive circuit, the word line voltage being derived from the virtual supply voltage; and enabling a keeper circuit after the predetermined delay upon deactivating the word line underdrive circuit, the keeper circuit being operative to provide the virtual supply voltage.

7. A method for controlling memory access comprising:

during a write access initiated by a write request, driving a word line voltage below a nominal level, wherein the write access is operative to write data to at least one memory cell of a plurality of memory cells; and during the same write access, increasing the word line voltage above the nominal level after a predetermined delay following the write request, wherein the word line voltage is increased above the nominal level after the predetermined delay based on a supply voltage level of the plurality of memory cells being below a threshold supply voltage level.

8. The method of claim 7, wherein the predetermined delay is configured to allow a bit line voltage of at least one memory cell of the plurality of memory cells to decrease to threshold voltage level prior to increasing the word line voltage.

9. The method of claim 8, wherein the threshold voltage level is less than the supply voltage level of the plurality of memory cells.

10. The method of claim 7, wherein the nominal level is the supply voltage level of the plurality of memory cells and wherein the word line voltage is derived from a virtual supply voltage derived from a main memory supply voltage.

11. The method of claim 7, wherein the word line voltage is driven below the nominal level upon receipt of the write request.

12. The method of claim 11, further comprising, in response to receiving the write request, increasing the word line voltage substantially to the nominal level after a first predetermined delay and increasing the word line voltage above the nominal level after a second predetermined delay, the second predetermined delay being greater than the first predetermined delay.

13. The method of claim 12, wherein the first predetermined delay is stored in a word line driver control module and is based on a rate at which a bit line voltage of at least one memory cell decreases to a threshold voltage level, and wherein the second predetermined delay is based on the first predetermined delay.

14. The method of claim 7, wherein the increasing comprises:

deactivating, during the write access, a word line underdrive circuit operative to drive the word line voltage below the nominal level; and in response, activating a word line overdrive circuit operative to increase the word line voltage above the nominal level after the predetermined delay.

15. The method of claim 14, wherein the increasing further comprises:

disabling a header circuit operative to provide a virtual supply voltage upon deactivating the word line underdrive circuit, the word line voltage being derived from the virtual supply voltage; and enabling a keeper circuit upon activating the word line overdrive circuit, the keeper circuit being operative to provide the virtual supply voltage.

16. A memory access control system comprising:

a word line driver operative to increase a word line voltage above a nominal level during a write access after a predetermined delay in response to a write request operative to cause data to be written to at least one memory cell of a plurality of memory cells, wherein the word line voltage is increased above the nominal level after the predetermined delay based on a supply voltage level of the plurality of memory cells being below a threshold supply voltage level.

17. The system of claim 16, wherein the word line driver is further operative to drive the word line voltage below the nominal level during the write access in response to receiving the write request.

18. The system of claim 16, wherein the nominal level is the supply voltage level of the plurality of memory cells and wherein the word line voltage is derived from a virtual supply voltage derived from a main memory supply voltage.

19. The system of claim 16, wherein the word line driver comprises a word line underdrive circuit operative to drive the word line voltage below the nominal level during the write access and a word line overdrive circuit operative to increase the word line voltage above the nominal level after the predetermined delay, and wherein the word line underdrive circuit is deactivated and the word line overdrive circuit is activated after the predetermined delay.

20. The system of claim 19, wherein the word line driver further comprises a header circuit operative to provide a virtual supply voltage, wherein the word line voltage is derived from the virtual supply voltage, and wherein the header circuit is deactivated after the predetermined delay.

21. The system of claim 19, wherein the word line driver further comprises a keeper circuit operative to provide a virtual supply voltage, wherein the word line voltage is derived from the virtual supply voltage, and wherein the keeper circuit is activated after the underdrive circuit is deactivated.

22. The system of claim 16, wherein the word line driver receives the write request operative to cause data to be written to the at least one memory cell of the plurality of memory cells.

23. A computer readable medium comprising:

executable instructions for execution by an integrated circuit production system such that when executed cause the integrated circuit production system to produce an integrated circuit comprising:

a word line driver operative to increase a word line voltage above a nominal level during a write access after a predetermined delay in response to a write request operative to cause data to be written to at least one memory cell of a plurality of memory cells, wherein the word line voltage is increased above the nominal level after the predetermined delay based on a supply voltage level of the plurality of memory cells being below a threshold supply voltage level.

24. The computer readable medium of claim 23, wherein the word line driver is further operative to drive the word line voltage below the nominal level during the write access in response to receiving the write request.

25. The computer readable medium of claim 23, wherein the executable instructions are in a hardware description language (HDL) or register-transfer level (RTL) format.

26. A computer readable medium comprising:

data representing a library cell comprised of:

a word line driver operative to increase a word line voltage above a nominal level during a write access after a predetermined delay in response to a write request operative to cause data to be written to at least one memory cell of a plurality of memory cells, wherein the word line voltage is increased above the nominal level after the predetermined delay based on a supply voltage level of the plurality of memory cells being below a threshold supply voltage level.

* * * * *